United States Patent [19]

Pinder et al.

[11] 4,036,645

[45] July 19, 1977

[54] PHOTODETECTORS AND THIN FILM PHOTOVOLTAIC ARRAYS

[75] Inventors: Russell Stuart Pinder; Leslie Clark, both of Newcastle-upon-Tyne, England

[73] Assignee: International Research and Development Company Limited, Newcastle-upon-Tyne, England

[21] Appl. No.: 559,483

[22] Filed: Mar. 18, 1975

[30] Foreign Application Priority Data

Mar. 21, 1974 United Kingdom ............. 12648/74

[51] Int. Cl.$^2$ ............................................. G03C 5/00
[52] U.S. Cl. ................................... 136/89 C; 96/36.2; 96/36; 29/572; 29/578; 148/187; 427/74; 427/85; 427/88
[58] Field of Search ............... 96/36.2, 36; 427/85, 427/74, 88; 136/89; 29/572, 578; 148/187

[56] References Cited

U.S. PATENT DOCUMENTS

| | | | |
|---|---|---|---|
| 3,290,175 | 12/1966 | Cusano et al. | 136/89 |
| 3,416,956 | 12/1968 | Keramidas et al. | 427/74 |
| 3,568,306 | 3/1971 | Yamashita | 136/89 X |
| 3,571,915 | 3/1971 | Shirland | 136/89 X |
| 3,836,399 | 9/1974 | Pruett | 136/89 |
| 3,858,304 | 1/1975 | Leedy et al. | 96/36.2 X |
| 3,888,697 | 6/1975 | Bogus et al. | 427/74 X |

*Primary Examiner*—Mayer Weinblatt
*Attorney, Agent, or Firm*—Robert F. O'Connell

[57] ABSTRACT

A photo-voltaic hetero-junction is formed by chemical conversion of surface regions of a sheet of one conductivity type into material of a second conductivity type, the areas which are not to be converted being covered by a developed photo-resist layer which has previously been exposed to light through a mask. Electrical contacts are deposited on the regions of the second type and contacts to the material of the first type are formed by a layer deposited on a substrate under the sheet of material of the first type. This deposited layer of electrically-conductive material can also form the mask for initial exposure of the photo-resist layer.

13 Claims, 4 Drawing Figures

PHOTODETECTORS AND THIN FILM PHOTOVOLTAIC ARRAYS

The present invention relates to the formation of photovoltaic hetero-junctions between semi-conducting materials of first and second conductivity types.

The first and second materials may be of n-type and p-type, respectively, and in a preferred case are on the one hand a chalcogenide of a metal in Group II of the Periodic Table, for example, cadmium sulphide, cadmium telluride, or cadmium sulphide telluride, and on the other hand the same chalcogenide of copper or silver, for example, copper sulphide, telluride or copper sulphide telluride, respectively. The cadmium compounds can be chemically converted to the corresponding copper compounds to form the p-type material from the n-type material. The hetero-junctions produced in accordance with the invention may be used in opto-electronic converters.

In accordance with the invention a method of forming a photovoltaic hetero-junction of the kind specified comprises the steps of i. coating a sheet of semi-conducting material of the first type with a layer of photo-resist material;

ii. exposing at least one area of the photo-resist layer to light by way of masking means;

iii. developing the photo-resist layer and removing the unexposed part of the layer to uncover a region of the said sheet of semi-conducting material of the first type;

iv. chemically converting the surface of the said uncovered region into semi-conducting material of the second type; and v. applying electrically-conductive material to the semi-conducting material of the second type to provide a contact to the hetero-junction.

The applied electrically-conductive material may extend over the material of the first type and be electrically insulated from it by the photo-resist material.

An electrical contact or contacts for the sheet of semi-conducting material of the first type can be formed by electrically-conductive material deposited in the form of a layer on a substrate, the sheet being laid down over the electrical contact(s). In this case the layer of electrically-conductive material may serve as the mask for exposing the photo-resist layer by means of light passing through the substrate and through the semi-conducting material of the first type.

The method can be employed to form single junctions or arrays of junctions. In the latter case the array may have a common contact to a layer of material of the first type and individual contacts to the regions of the second type. Alternatively, individual junctions in the array can be connected in series.

In one example, the photo-voltaic hetero-junction produced by the method of the invention comprises a substrate carrying a photocrystalline layer of n-type cadmium sulphide and having at least one surface region of p-type copper sulphide formed in the surface of the cadmium sulphide layer remote from the substrate, the surface of the cadmium sulphide layer surrounding the copper sulphide region or regions being selectively over-laid by one or more electrically conductive contacts which contacts are electrically isolated from the cadmium sulphide.

The invention will now be further described with reference to the accompanying drawings, in which.

Figure 1:
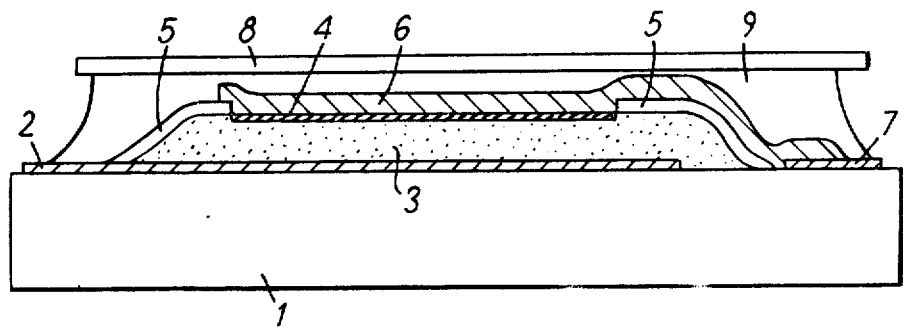
FIG. 1 shows a cadmium sulphide-copper sulphide photo-voltaic hetero-junction according to one form of the present invention.

Referring to FIG. 1, the diagrammatic cross-section of a hetero-junction according to the invention shows a substrate 1 carrying a base metallization layer 2 over which is deposited a cadmium sulphide film 3. The substrate may be of glass or high temperature plastics and in some cases a high temperature glass-resin printed circuit board of smooth surface finish may be used. The base metallization layer 2 must be suitably conductive to act as an electrical contact to the cadmium sulphide film 3. It should be noted that the thickness of the substrate and various layers is highly exaggerated in the Figures for the sake of clarity.

A region 4 of the hetero-junction consists of a surface layer of copper sulphide which has been selectively converted from the cadmium sulphide film 3 and defined by means of a photo-resist process. Photo-resist material 5 from this process is left in position to act as insulation between the cadmium sulphide and a further metallization deposit 6 forming a further contact for the hetero-junction. The deposit 6 may extend to make electrical contact with a further metallization layer 7 on the substrate 1. Layer 7 may comprise a contact for an adjacent hetero-junction to that shown in an array of hetero-junctions formed on the substrate 1. Layer 7 may comprise a single strip or a pattern of conducting material vacuum deposited in film form.

The structure of the hetero-junction is completed by thin glass encapsulation layer 8 held in position by transparent resin 9.

Whilst the embodiment of the invention shown in FIG. 1 is that of a single hetero-junction the scope of the invention extends to arrays of hetero-junctions of the type shown in which the substrate 1 forms a common base. Such arrays preferably take the form of a single large area pad of cadmium sulphide film on the substrate into which individual p-type cuprous sulphide regions are simultaneously formed, giving the hetero-junctions in the array a common negative contact. Alternatively, where complete isolation between hetero-junctions is required, individual regions of cadmium sulphide may be formed on a substrate with suitable associated contact metallization.

A method of formation of a hetero-junction according to the invention will now be described with reference to FIGS. 2 to 4.

Figure 2:
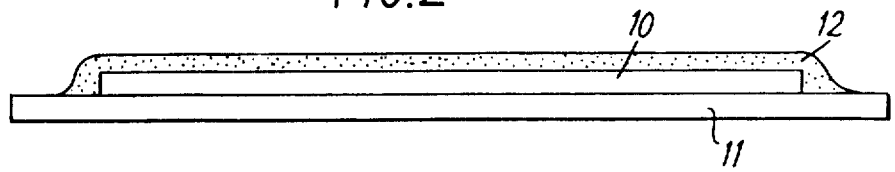
FIG. 2 shows an early stage in the production of a hetero-junction of the type shown in FIG. 1 by a method according to the present invention.
Figure 3:
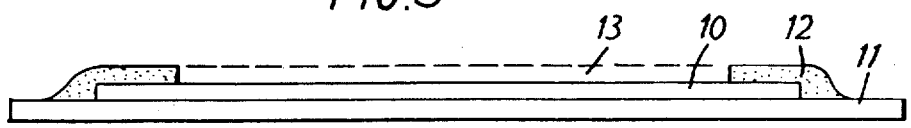
FIG. 3 shows an intermediate stage in the production of the hetero-junction shown in FIG. 2.

Referring to FIG. 2, a polycrystalline cadmium sulphide layer 10 is deposited on a substrate 11 by, for example, thermal evaporation or sputtering in a vacuum system, or by screen printing. A photo-resist layer 12 is applied over the layer 10 and, by conventional exposure and development, apertures 13 are opened in the resist, as shown in FIG. 3.

Appropriate chemicals, for example, cuprous chloride, are introduced into the apertures, e.g. by immersion in a liquid or by vacuum deposition, or by spraying, and if necessary following this by a thermal treatment. Cuprous sulphide regions 14, as shown in FIG. 4, are thus formed in the surface of the original cadmium sulphide layer 10. Electrical contact to the upper layer of material can be made as shown in FIG. 4 in which a conductor element 15 is deposited over the photo-resist 12 and overlaps regions 14, the photo-resist 12 acting as an insulator between the contact 15 and the layer 10.

Figure 4:
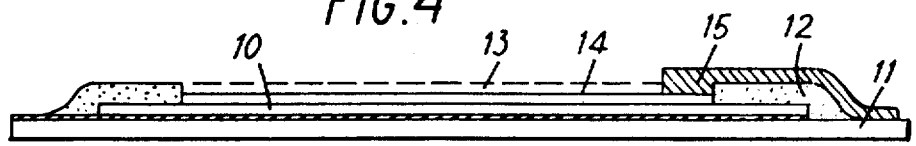
FIG. 4 shows a final stage in the production of the hetero-junction shown in FIGS. 2 and 3.

Contact to the layer 10 could typically be made by a metallized layer 16, as shown in FIG. 4 on the face of substrate 11, and could be formed prior to deposition of layer 10 on substrate 11.

By means of the constructions described with reference to FIGS. 2 to 4 an active hetero-junction region is defined and electrical connection is provided. Thus use of a photo-sensitive material (photo-resist) itself defines the area of semi-conductor surface to be chemically converted to form a region of different chemical composition and conductivity type so that the junction acts as a photo-detector and enables the resist to act as an insulator over which electrical contacts may be taken.

The relatively small number of processing steps in formation of hetero-junctions according to the invention, coupled with the low material cost, permits a custom designed approach to be applied to the production of detector arrays. Chosen capacitance values for the hetero-junction may be readily achieved during manufacture and current output from diode to diode in an array is exceptionally uniform.

The hetero-junctions may be operated in a photo-voltaic mode in the absence of external biassing voltage, or if reverse bias voltage is applied they may be operated in a photo-conductive mode. The latter mode enables increased operational speed to be achieved, but high linearity of output with illumination is achieved in either mode.

It is possible to use individual diodes, or arrays of $CdS-Cu_2S$ diodes, in a wide variety of opto-electronic applications where accurately defined, well matched photodiodes at a reasonable price are required. Diode areas and geometries are not so constrained as in more conventional single crystal technologies, the vacuum deposition and subsequent processing stages giving considerable scope for quality diodes on substrates which can be large or small, transparent or opaque, rigid or even flexible.

In applications where it is necessary to employ amplification or scanning circuitry in conjunction with the $CdS-Cu_2S$ diodes the packages can be incorporated directly onto the substrate using hybrid circuit bonding techniques. Otherwise, by careful choice of detector format, sufficient signal may be obtained for parallel processing in analogue or digital mode.

We claim:
1. In a method of forming a photo-voltaic hetero-junction in which at least one region of a semi-conducting material of a first conductivity type is treated through an opening in a resist layer to convert said at least one region into semiconducting material of a second conductivity type, the improvement which comprises the steps of:
   i. coating a layer of semi-conducting material of the first conductivity type with a layer of photo-resist material applied directly to the semi-conducting material;
   ii. exposing at least one area of the photo-resist layer to light by way of masking means;
   iii. developing the photo-resist layer and removing the unexposed part of the layer to uncover at least one region of the said layer of semi-conducting material of the first conductivity type;
   iv. introducing a chemical capable of converting the surface of the said at least one uncovered region into semi-conducting material of the second conductivity type to form a hetero-junction thereat; and
   v. applying electrically-conducting material to the semi-conducting material of the second conductivity type to provide a contact to the hetero-junction.

2. A photo-voltaic hetero-junction produced by the method claimed in claim 1.

3. A method as claimed in claim 1 wherein step (v) includes applying the electrically-conductive material also to the exposed area of the photo-resist layer whereby said photo-resist layer electrically insulates the said contact from the said layer of semi-conducting material of the first conductivity type.

4. A photo-voltaic hetero-junction produced by the method claimed in claim 3.

5. A method as claimed in claim 1 including the further steps of:
applying at least one region of electrically-conductive material to a substrate, and
forming the said layer of semi-conducting material of the first conductivity type on the substrate and overlying the said region of electrically-conductive material whereby the said region forms an electrical contact to the layer of semi-conductivity material of the first conductivity type.

6. A method as claimed in claim 5 wherein step (ii) includes using said at least one region of electrically-conductive material applied to the substrate as the masking means for light incident on the photo-resist layer through the substrate and through the layer of semi-conducting material of the first conductivity type.

7. A photo-voltaic hetero-junction produced by the method claimed in claim 5.

8. A method as claimed in claim 1 in which said semi-conducting material of the first conductivity type is n-type material and said semi-conducting material of the second conductivity type is p-type material.

9. A method as claimed in claim 8 in which the n-type material is a chalcogenide of a metal in Group II of the Periodic Table and the p-type material is the same chalcogenide of copper or silver.

10. A method as claimed in claim 9 in which the n-type material is selected from cadmium sulphide, cadmium telluride, and cadmium sulphide telluride, and the p-type material is the corresponding copper compound.

11. A photo-voltaic hetero-junction produced by the method claimed in claim 10.

12. A method as claimed in claim 1 in which a plurality of regions are uncovered in step (iii), chemically converted in step (iv), and provided with electrical contacts by step (v) to produce an array of hetero-junctions.

13. A photo-voltaic hetero-junction produced by the method claimed in claim 12.

* * * * *